United States Patent [19]
Tirrell et al.

[11] Patent Number: 5,828,546
[45] Date of Patent: Oct. 27, 1998

[54] DEVICE COVER AND EJECTION APPARATUS AND METHOD

[75] Inventors: Paul T. Tirrell, Uxbridge; William R. Tuccio, Sutton, both of Mass.

[73] Assignee: EMC Corporation, Hopkinton, Mass.

[21] Appl. No.: 406,358

[22] Filed: Mar. 20, 1995

[51] Int. Cl.[6] ...................................................... H05K 5/00
[52] U.S. Cl. ...................... 361/685; 361/684; 439/928.1
[58] Field of Search .................. 361/683–686, 361/694, 726, 727; 439/620, 945, 928, 928.1, 929

[56] References Cited

U.S. PATENT DOCUMENTS

| Re. 34,369 | 9/1993 | Darden et al. | 439/377 |
|---|---|---|---|
| 4,858,070 | 8/1989 | Buron et al. | 361/695 |
| 5,222,897 | 6/1993 | Collins et al. | 439/157 |
| 5,370,495 | 12/1994 | Montalvo et al. | 414/797.9 |
| 5,392,192 | 2/1995 | Dunn et al. | 361/683 |
| 5,402,285 | 3/1995 | Theobold, Jr. et al. | 360/69 |

FOREIGN PATENT DOCUMENTS 1-205784 (A) 8/1989 Japan.

*Primary Examiner*—Leo P. Picard
*Assistant Examiner*—Jayprakash N. Gandhi
*Attorney, Agent, or Firm*—Maureen Stretch

[57] ABSTRACT

A customer removable storage system peripheral device cover is formed from two symmetrical right and left covers, each having a number of air channel openings spaced to meet finger insertion safety requirements. The covers are fastened together around grooved symmetrical guides hot staked on either side of a drive carrier. Inside the covers, a floating disk adaptor board is included at the rear to electrically connect the drive to the storage system. A ribbon wire cable is placed along the bottom of the interior of the device cover, to connect to an LED panel on the front of the device cover. An ejector pivotally attached to the device cover has locking tabs that grip a shelf of the chassis at the position where the drive is to be inserted, and propel the covered drive inward along rails in the chassis that fit into grooved symmetrical guides to snap the covered drive into its position and connect it to a backplane. Guide pins in the backplane match openings in the floating board disk adaptor's gang connector at the rear of the device cover to insure proper insertion. When a latch in the ejector is released, the front planar surface moves down to engage with a shelf of the chassis within which the covered drive is mounted. A downward pivot of the ejector propels the covered drive out of its position for removal. A simple manufacturing process is used to assemble a drive within the covers of the invention.

38 Claims, 14 Drawing Sheets

DEVICE COVER AND EJECTION APPARATUS AND METHOD

BACKGROUND OF THE INVENTION

This application relates generally to the manufacture of computer peripheral devices and more particularly to the manufacture of covers and ejector mechanisms for removable drives in storage systems.

Manufacturers of removable storage device systems, such as RAID (Redundant Array of Inexpensive Disks) hard disk drives, face a number of problems in manufacturing removable devices that are also designed to be grouped together into a larger unit or array.

To make a drive capable of being removed safely from a chassis, the drive's covers must protect the drive from electrostatic discharge (ESD) from the customer or service person. Even more important, the human removing the drive should be protected from the voltages on the drive and the board and from any sharp edges that might cut the human operator. Ideally, the drive with its cover(s) should also be easy to carry and comfortable to use, so that when it is carried, it is still not possible for the operator to touch anything inside.

In addition, it is important that removable drives can be inserted into a chassis or housing in a way that creates and maintains electrical contact with the backplane that connects the drive to the array or controller. One difficulty with some removable drive designs is that they can increase the likelihood of breaking or bending pins or connectors upon insertion or ejection.

Some conventional methods of addressing these problems require special tools in order for the drive to be installed or removed. Some ejection devices, for example, need screw fasteners or rotational fasteners that must be used to install the drive. Screwdrivers or similar tools are needed to do the installation.

Some drives have ejection systems that need to be squeezed to eject the drive. However, some ejection systems are constructed in such a way that squeezing them may cause the operator to lose a fingernail or hurt a finger. Still others are so small that their functions as ejection systems are not apparent to the user. Still others may require that a considerable pushing or pulling force be used while the ejection mechanism is being operated to insert or remove the drive. If too much force, or an inconsistent force is applied on injection, connecting pins can be damaged or a connection may not be properly made and maintained. In many cases, it is not a simple matter for the user to determine how to use the ejection mechanism.

Drive covers or enclosures that are capable of protecting the device from ESD and the human from the voltages inside the drive often have the disadvantage of limiting or eliminating open space around the drive. Many peripheral devices used for dynamic storage in a computer system have motors and moving parts, that generate heat during operation. Heat is one of the main causes of hard disk drive failure, for example, as are vibration and damaged or bad circuitry. Dissipating the heat generated by such drives is thus made more difficult if the cover limits or seals out air flow and open space. Some conventional covers have slits in the front and/or the rear so that air movers such as fans or blowers or other devices can be used from the front or the rear to cool the drives. However, even with such openings, the amount of open area through which the air can flow is significantly limited. More powerful (and expensive) air movers or other cooling mechanisms may need to be used to compensate for this. If a number of air moving devices are used, to direct air, this also adds to the cost and the overall size of the storage system, putting it at a competitive disadvantage.

Vibration of the drive is affected by the stability and tightness of the drive's fit when inserted into the array, in a RAID magnetic storage system for example. Covers and mechanisms that do not provide for a stable fit, may cause early failure of the drive as a result of vibration. Alternatively, covers that provide a tight and stable fit are sometimes harder to eject and remove, as a result.

Ease of installation and removal also affect service costs. In large RAID systems for example, having a fairly large number of removable drives, it can take as long as an hour or more to insert all the drives into the array. Labor costs for the manufacturer (in assembly and service personnel) as well as for the user, are affected by the length of time needed to insert or remove a drive. If special tools and training are required, as with some systems, these costs increase.

Another problem facing the manufacturer is the degree to which a device's cover has to be custom designed for it. Some manufacturers design a device cover for a specific type of drive mounting and support mechanism. In these systems, if a drive with different mounting or support features is to be used, a major part of the cover must be re-designed and manufactured for it. This also increases costs.

In manufacturing and assembling conventional drives with conventional covers, it is common for the assembler to have to balance the drive in order to assemble it. This can increase the complexity or time to manufacture and leads to more cost.

For drives to be easily installable it is also important that the customer or user be prevented, if possible, from installing them the wrong way, and thus causing damage. In conventional systems, where custom covers are used, this can be avoided by customizing the cover for that purpose as well. Again, with such customized covers, it is costly for the storage system manufacturer to substitute drives of comparable features and size that have different mounting, and support characteristics. A complete new design together with new injection molds or dies may required.

Systems with customer removable drives also need some way to indicate to the operator which drive is to be removed, when that is requested by the system using the drive. This can usually be accomplished in conventional systems by causing the drive which is to be removed to be indicated by one or more LED displays. Conventional approaches to this have often been custom ones, as well. The way the system may indicate that a drive is to be removed can be different for different drive mechanisms, particularly if a drive's own indicator LED's are used. This, too, is usually treated as a custom feature that needs to be changed if a different drive mechanism is used.

It is an object of the present invention to provide a device cover for a customer removable peripheral that shields the peripheral from ESD and the operator from the voltage of the peripheral unit and from sharp edges.

It is another object of the present invention to provide a device cover and ejector mechanism for a customer removable peripheral that does not require special tools for insertion or removal.

Still another object of the present invention is to provide an ejector for a customer removable peripheral that decreases the amount of pushing or pulling of the drive needed to initiate removal.

Yet another object of the present invention is to provide an ejector mechanism for a customer removable peripheral that is simple to understand and use.

Still another object of the present invention is to provide a device covering and ejector mechanism that provides and maintains a stable electrical connection and fit.

SUMMARY OF THE INVENTION

These and other objects of the invention are achieved by a storage system peripheral device covering that is formed from two symmetrical right and left covers, each having a number of air channel openings spaced to meet finger insertion safety requirements. The covers are fastened together around grooved symmetrical guides hot staked on either side of a drive carrier. Inside the covers, a floating disk adaptor board is included at the rear to electronically connect the drive to the storage system. A ribbon wire cable leading from the floating disk adaptor board is placed along the bottom of the interior of the device cover, to connect to an LED panel on the front of the device cover. An ejector pivotally attached to the device cover has locking tabs that grip a shelf of the chassis at the position where the drive is to be inserted, and propels the covered drive inward along rails in the chassis that fit into the grooved symmetrical guides to snap the covered drive into its position and connect it to a rigid backplane. Guide pins in the backplane match openings in the floating board disk adaptor's gang connector at the rear of the device cover to insure proper connection to the backplane. The ejector has a latch inserted into a planar front surface, in such a way that when the latch is released, the ejector front planar surface moves down to engage with a shelf of the chassis within which the covered drive is mounted. A downward pivot of the ejector propels the covered drive out of its position for removal. In the manufacturing process, a peripheral device is placed on an ESD mat, mounted on a drive carrier, connected to a floating disk adaptor board, the LED panel, the device cover and ejector.

It is a feature of the present invention that the air channels of the symmetrical covers are spaced so that the covers meet generally accepted finger insertion safety requirements, such as those suggested by the Underwriters Laboratory finger insertion test devices.

It is another feature of the present invention that the air channels in the covers optimize the amount of open area around the drive, permitting heat to be dissipated more easily and cost effectively. This, in turn, permits more drives to be included in one system. This feature can also be used to minimize the floorspace or "footprint" of the overall system.

It is yet another feature of the present invention that the open area is optimized so that air flow used to dissipate heat can be directed from the top or bottom of the system, from the front or rear, from the sides, or form one or more combinations of these, depending upon the type of housing, chassis and air movers used.

Still another feature of the present invention is that its ejector, when used to insert the drive, provides a stable fit both physically and electrically, that lowers or eliminates damaging vibration without increasing the force required to insert or remove the drive.

It is an aspect of the present invention that it can reduce installation time by a significant amount. In a multiple unit RAID hard disk drive systems having 96 customer removable drives, for example constructed in conventional ways, it might take an installer an hour or more to insert all the drives. The present invention allows the installer to perform the same task in about 10 minutes. As the number of drives in a system increase into the hundreds, or more, corresponding savings in installation time and labor costs increase.

It is another aspect of the present invention that it minimizes the amount of customization and redesign needed to accommodate drives with different mounting characteristics. In a preferred embodiment, only one part in the device cover may need to be changed to adapt it for a different drive. All the other parts of the cover and ejector mechanism, including LED indicators, can be standard, mass-produced parts used for any number of drives that can fit into a given form factor, without regard to their respective mounting characteristics. Manufacturing costs for customization are thus reduced.

It is still another aspect of the present invention that it simplifies the manufacturing process for the device cover. In a preferred embodiment, the assembly line worker does not need to balance the drive while installing the device cover. Instead, the drive can be placed on an ESD mat so that the device covers can be fastened on easily.

Still another aspect of the present invention is that simple guide pins inserted off center around a pin connector in the backplane mate with openings in the gang connector and floating board disk adaptor of the device cover to prevent the covered drive from being inserted the wrong way or flipped around.

DETAILED DESCRIPTION OF THE INVENTION

Figure 1:
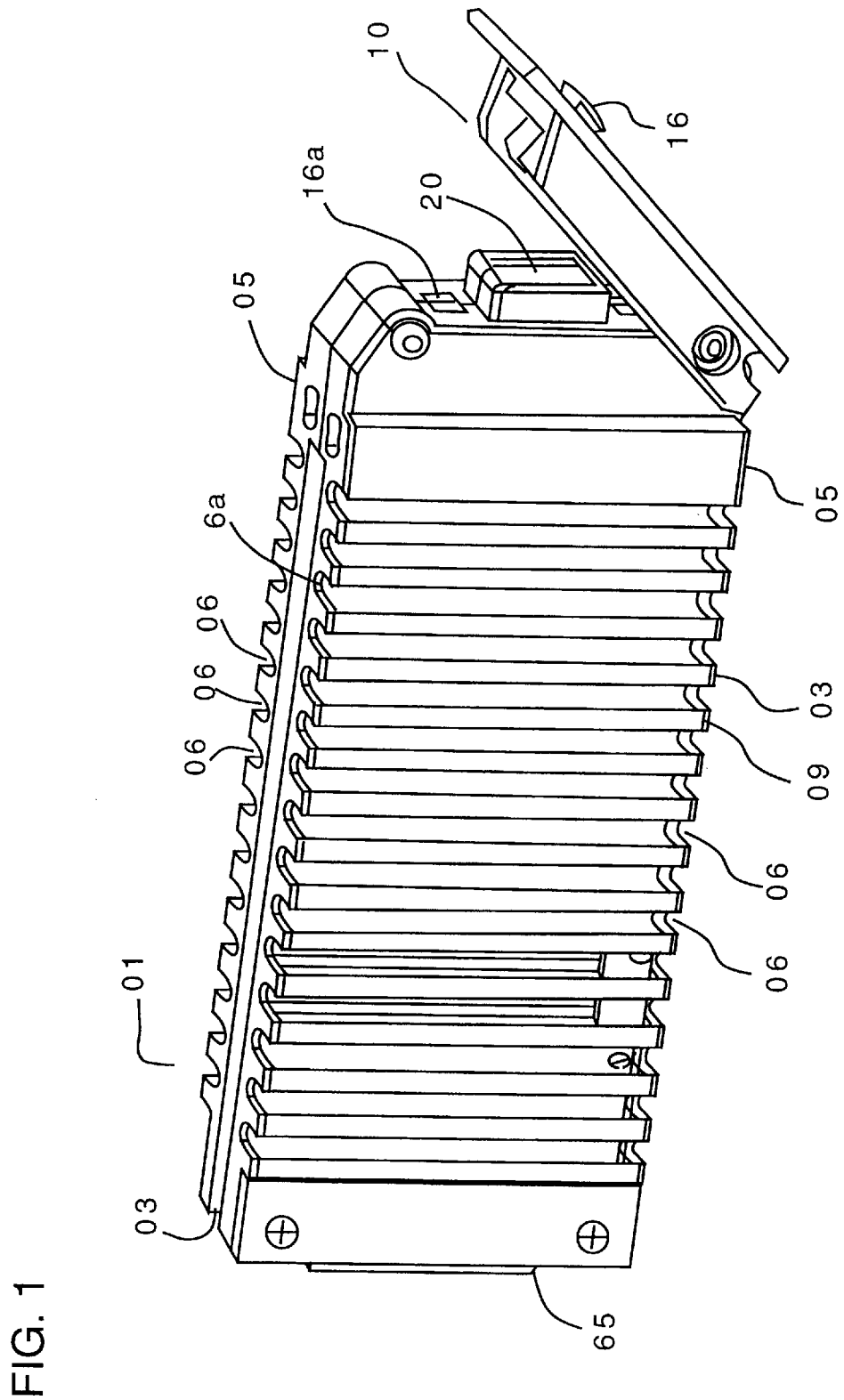
FIG. 1 is a perspective view of the device cover taken from the side.

In FIG. 1, a preferred embodiment of device cover 1 of the present invention is shown. Device cover 1 comprises two covers 5, having a number of air channels 6 formed between ribs 9. Covers 5 are fastened around guides 3, which have been hot staked to a drive carrier (inside covers 5 as described below.) An individual storage drive mechanism is mounted inside the drive carrier as will be described below. Ejector 10 is pivotally fastened to the front of device cover 1. Latch 16 forms part of ejector 10 and fits into an opening 16a in the front of assembled device cover 1. LED panel 20, shows through the device cover 1 and ejector 10. Gang connector 65 protrudes from the rear of device cover 1, so that the entire mechanism can be inserted into a chassis within a drive array housing and connected to a backplane as will be described below.

In a preferred embodiment, cover 5 is a symmetrical, rigid plastic component produced by injection molding, using an ABS (acrylonitrile butadiene styrene) polycarbonate resin. Any plastic or polycarbonate resin which is sufficiently rigid to serve as a cover could be used, provided that it has a 94V-0 Underwriters Laboratory flame retardant rating. In a preferred embodiment, some flexibility is retained in the ABS resin used so that a thinner wall can be formed to allow more air flow and hence heat dissipation. Covers 5 need not be prevented from deforming under downward pressure such that they cannot come in contact with the drive, for example. They will still shield a drive from ESD if a finger is unable to fit between ribs 9 to touch the drive, even if ribs 9 are deformed downward, To the extent that a more rigid drive is required, the wall thickness of cover 5 may need to be increased. However, increasing width of the walls can diminish the amount of air space available in the cover 5 for heat dissipation. In a preferred embodiment, the ABS resin used permits a wall thickness of 0.08 inch or 80,000th, and some flexing is allowed in cover 5.

Other preferred embodiments could use new resins or other plastics or conductive plastics that have the same or improved rigidity as well as other desirable features, such as improved cost effectiveness or improved flowability in a mold.

In another preferred embodiment, where device cover 01 is intended to include some or all of its own electromagnetic emissions (EMI) shielding, covers 05 can be made from steel or any castable metal such as such as aluminum, or magnesium, or similar metals having sufficient rigidity, and EMI shielding effect.

As can be seen in FIG. 1, cover 5 has a number of air channels 6 which are open spaces in the rigid plastic between ribs 9. Air channels 6 are spaced so that they do not exceed a width of 0.25 inches. This width is chosen to comply with most commonly accepted finger insertion standards for devices of this type. A testing tool, known in the industry, as the Underwriter Laboratories finger insertion tool, can be used to verify that objects having widths in excess of 0.25 inches cannot be inserted into air channels 6. As is known in the art, these standards are designed to create openings that are not large enough for a human finger to fit inside or slip through. If they should change, the spacing of air channels 6 could be changed in a new mold or die to accommodate the new standard(s).

Still in FIG. 1, it can be seen that air channels 6 extend vertically up each side of cover 5. And, as is seen at air channel 6a the open area formed by each air channel 6 in a preferred embodiment extends up over the top edge of cover 5, exposing even more of any device inside to the movement of air flow. As will be apparent to those skilled in the art, air channels 6 could also be formed horizontally along the side of covers 5, or in a number of other ways through the use of injection molding or castable metals.

Figure 1A:
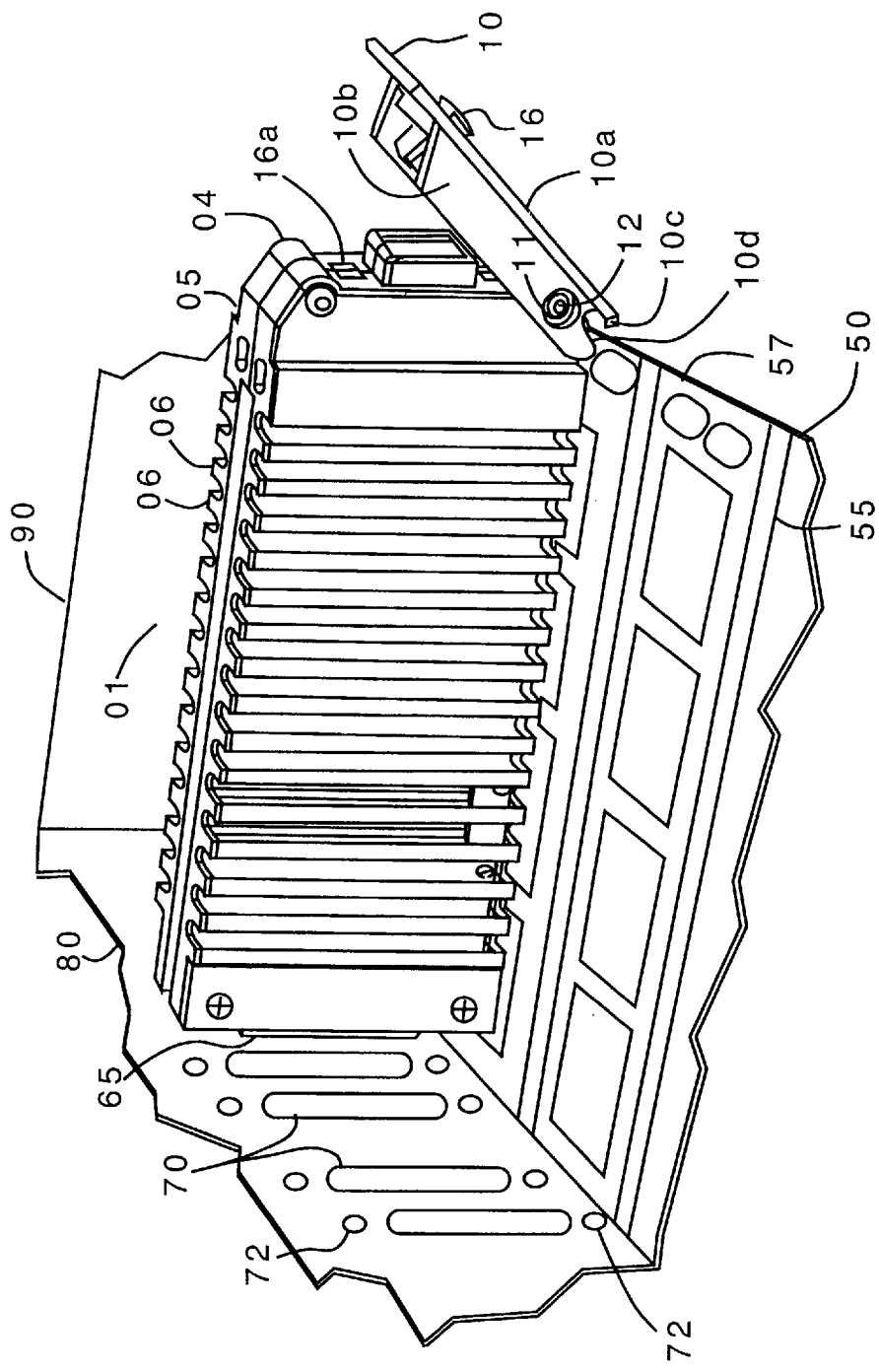
FIG. 1a is a perspective view of the device cover mounted on a chassis shelf according to the method and apparatus of the present invention.

Still in FIG. 1 each cover 5 has, in a preferred embodiment designed for a 3.5 inch disk drive, fifteen such air channels 6 that are formed. Depending upon the size of the device to be protected, longer or shorter covers could be designed that incorporate more or fewer air channels 6, as the dimensions of the unit allow. Turning now to FIG. 1a, the operation of ejector 10 can be seen. In FIG. 1a, a drive encased in device cover 01 is shown being inserted into a position on a chassis shelf 50 and connected to a backplane 80, which is part of a housing 90 having units of connector pins, 70. Note that guide pins 72 are placed near each set of connector pins 70. These mate with receptors in gang connector 65 to insert the device properly. It can be seen that ejector 10 includes a front planar surface 10a, which has two openings 14 at its lower extremity, through which fasteners 12 can be inserted to pivotally attach ejector 10 to hubs 4 on the front of device cover 01. Still in FIG. 1a, ejector 10's front planar surface 10a is formed with two inwardly extending side members 10b. The bottom lip 10c of ejector 10 forms a radiused ejector area. At the lower extreme of each side member 10b is a locking tab 10d that extends below front planar surface 10a to provide an injection mechanism. In a preferred embodiment, a commonly available latch 16, manufactured by Southco, and known as squeeze release latch is used to connect ejector 10 to assembled covers 05. As will be apparent to those skilled in the art, a variety of latches or similar mechanisms can be substituted for the one shown here.

Ejector 10 snaps over hubs 4 at the top of covers 05 when ejector 10 is moved upwards and latched. At the same time, locking tabs 10d fit into placement openings 57 in chassis shelf 50. These placement openings 57 are located on either side of each rail 55 in chassis shelf 50. The guide 3 located on the bottom of device cover 01 (not visible in this view) fits into a rail 55 and enables the covered drive to slide into place. As the locking tabs 10d grip placement openings 57, ejector 10 snaps over the bottom hubs 4 (also not visible in this view) and helps hold covers 5 together. As will be apparent to those skilled in the art, chassis shelf 50 could be formed using conventional slots and covers 5 could be modified according to accommodate slots, instead of rails.

According to the method and apparatus of the present invention, a covered drive is removed by releasing latch 16 in ejector 10. This enables ejector 10's front planar surface 10a to move down so that bottom lip 10c engages with chassis shelf 50. The downward and inward pivot of ejector 10 presses bottom lip 10c against chassis shelf 50 and propels the covered drive out of its position for removal. Minimal force is required to remove the covered drive in this manner not only because of the action of the ejector but also because rails 55 help the device slide out, as well as in, once removal has been initiated.

In a preferred embodiment, ejector 10 is made of ABS polycarbonate resin, but, as will be apparent to those skilled in the art, it, too, could be made of any sufficiently rigid and flame retardant plastic or metal that can be molded or cast.

Figure 2:
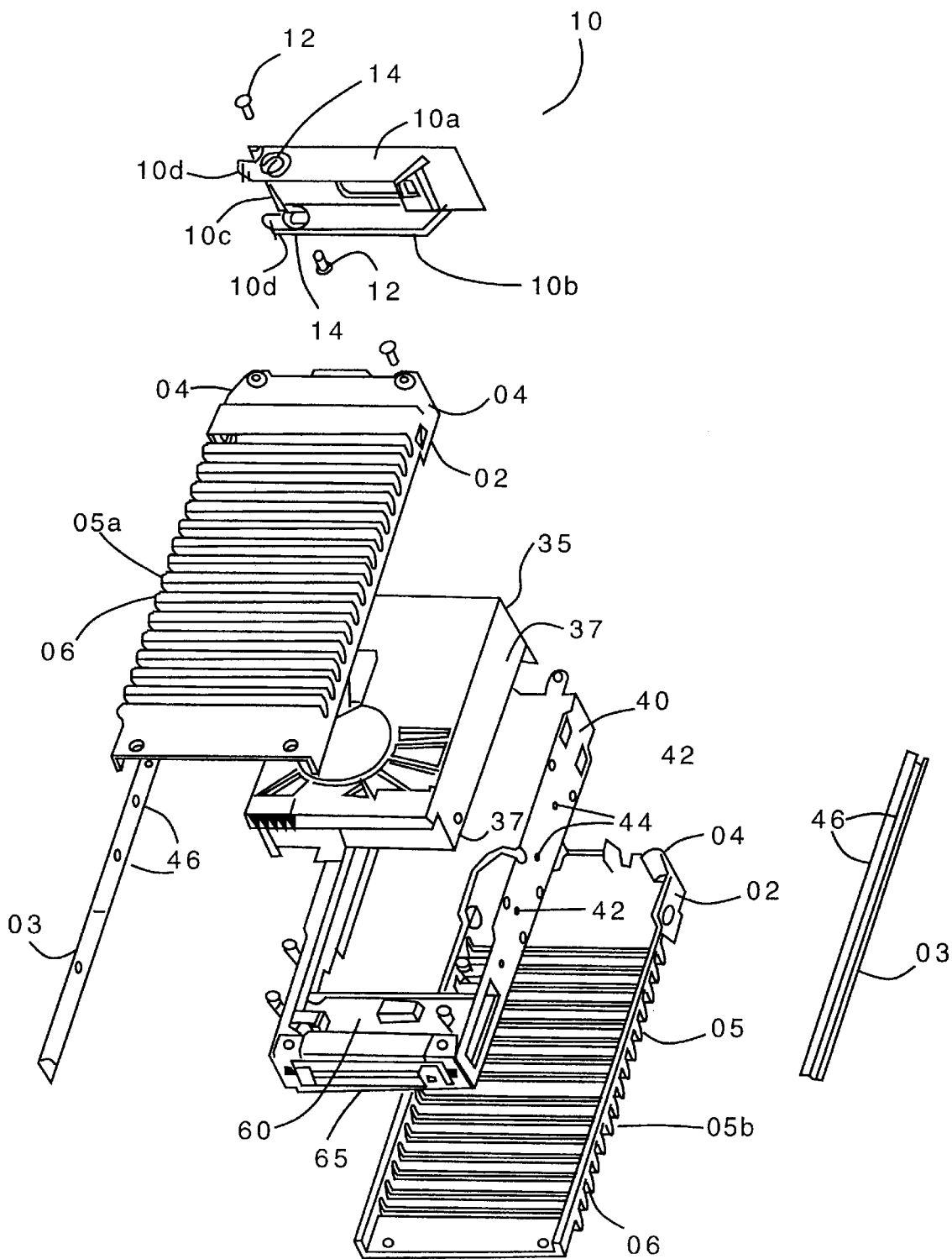
FIG. 2 is an exploded view of some of the components of the present invention, taken from the side.

Turning now to FIG. 2, an exploded side view of the components of drive cover 01 is shown. Two identical covers 5 are shown, one, cover 5a, is shown at the top of the drawing and another, cover 5b near the bottom. A number of air channels 06 are shown in each cover 05.

Drive 35, shown in FIG. 2, is a multi-gigabyte magnetic hard disk drive of a type used in RAID systems. However, as will be apparent to those skilled in the art, any of a number of other types of drives, such as magnetic tape drives or optical drives, or similar devices which are to be removably inserted into a cabinet or an array could be protectively covered by and use the ejector of, the present invention.

In FIG. 2, drive carrier 40 is shown having a floating disk adaptor board 60 at one end. In a preferred embodiment, drive carrier 40 is made of die cast metal. Floating disk adaptor board 60 is attached to a gang connector 65. Floating disk adaptor board 60, which is known in the art, is a printed circuit board movably connected to drive carrier 40, so that some freedom of movement is allowed to enable gang connector 65 to align and then connect with the connector pins 70 on backplane 80 (shown in FIG. 1a.) Floating disk adaptor board 60 also includes ribbon wires with connectors that connect power and logic pins to drive 35.

Symmetrical guides 3, each having a grooved outer side, are hot staked to the long exterior sides of drive carrier 40, through openings 44. In a preferred embodiment, this is accomplished by forming guides 3 with inwardly extending prongs 46 that are inserted through openings 44 in drive carrier 40 and then melted to bond or "hot stake" guides 3 to drive carrier 40. As will be apparent to those skilled in the art, other methods of attaching guides 3 to drive carrier 40, such as screws, snaps, rivets, bolts or other fasteners or bonding techniques could be used.

Still in FIG. 2, it can be seen that drive 35 has mounting openings 37 on its sides. These can be aligned with corresponding fastener openings 42 on each side of drive carrier 40. Drive 35 can be mounted inside drive carrier 40 and fastened therein with screws or any of a number of other fasteners.

In a preferred embodiment of the present invention, cover 5 is designed to be symmetrical so that only one injection mold or die need be made. Two identical covers, 5a and 5b, facing each other, are used to form the device covering of the present invention. Guides 3 are also symmetrical, so only one mold or die need be made for guides 3. As will be apparent to those skilled in the art, device cover 01 could be formed as one part, if, for example, drives could be inserted through an opening in one end of the cover. Alternatively, two non-symmetrical injections molds or die casts could be used if the features of certain drives or housings or systems made this desirable. Similarly, if slots instead of rails are used in chassis shelf 50, guides 3 could be modified to work with them, or even formed as part of each cover, if appropriate.

Also in a preferred embodiment, as shown in FIG. 2, each cover 5 has two hubs 4 formed at one end. Hubs 4 are rounded protrusions on each end of cover 05 that engage with ejector 10.

Drive carrier 40 is usually a custom part, designed to handle the particular mounting requirements of a particular type of drive 35. In a preferred embodiment, having a number of openings 42 and using floating disk adaptor board 60 permit drive carrier 40 to accommodate several different types of drives 35 with little or no modification in the fabrication of drive carrier 40. Different types of drives 35 can be accommodated simply by using different mounting openings 42 and/or installing floating disk adaptor board 60 upside down in drive carrier 40.

Figure 3:
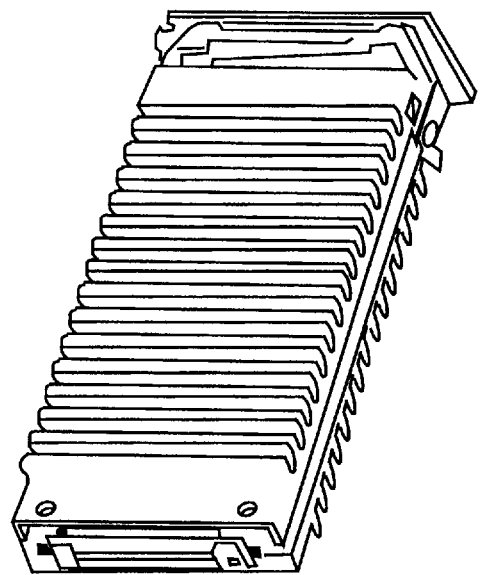
FIG. 3 is a perspective view of the device cover of present invention taken from above and behind.

In FIG. 3, a perspective top view of a drive covered according to the method and apparatus of the present invention is shown.

Figure 4:
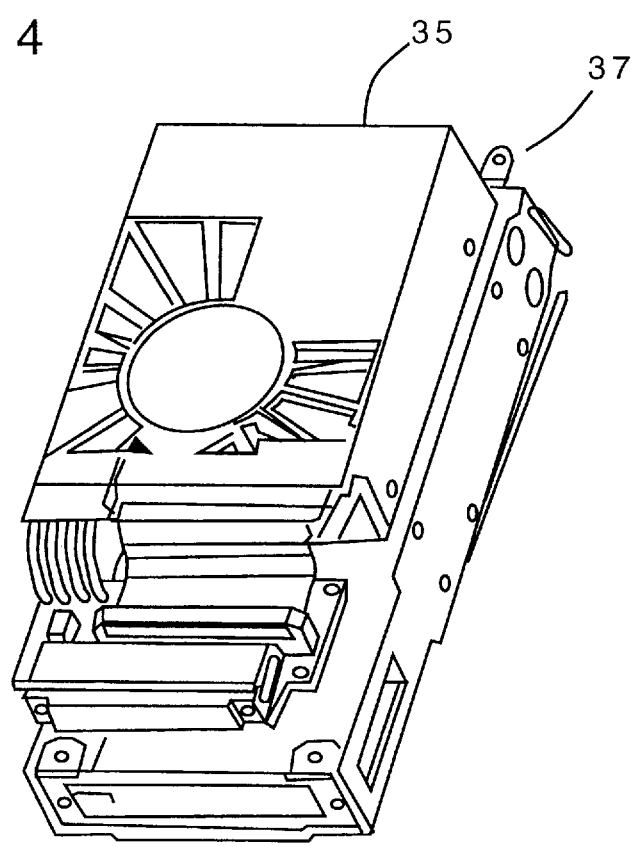
FIG. 4 is a perspective view of a peripheral drive with drive carrier.

FIG. 4 provides a more detailed view of drive 35 and drive carrier 40. Floating disk adaptor board 60 is shown here with ribbon cable 62 connecting it to drive 35. A second set of cables, 64 are used to carry power from floating disk adaptor board 60 to drive 35.

Figure 5:
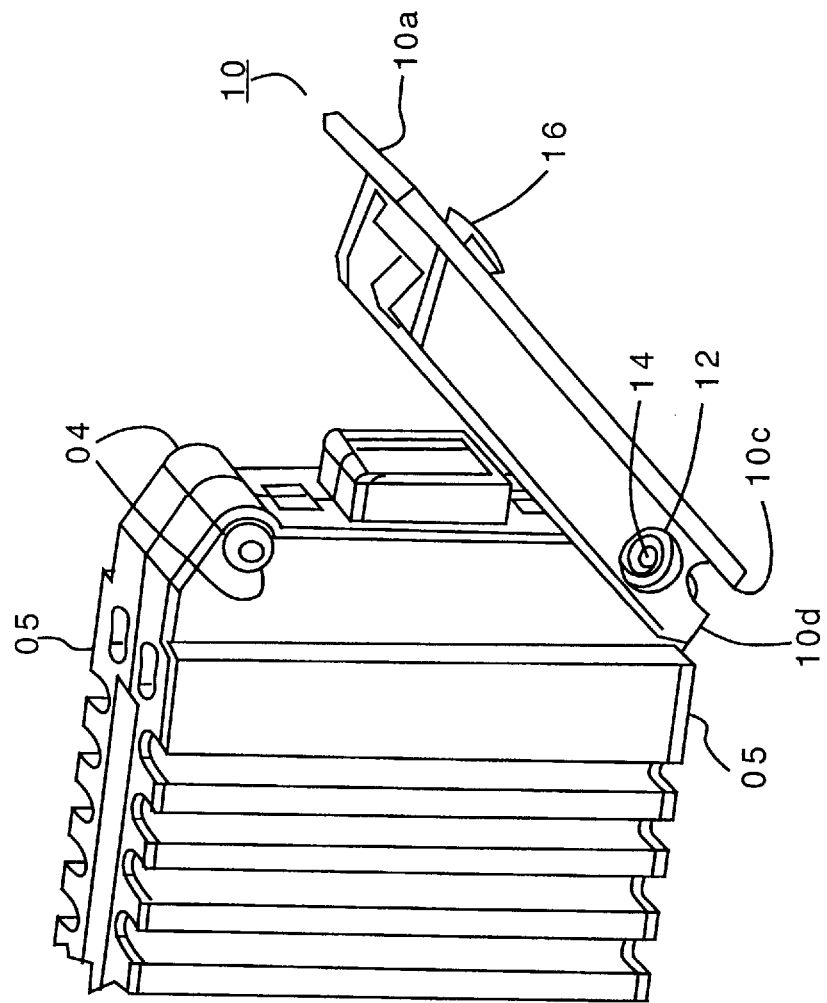
FIG. 5 is a perspective side view of the ejector portion of the present invention.

FIG. 5 provides a side view of ejector 10 pivotally attached to joined drive covers 5. LED panel 20 is also shown on the front of the joined drive covers.

Figure 6:
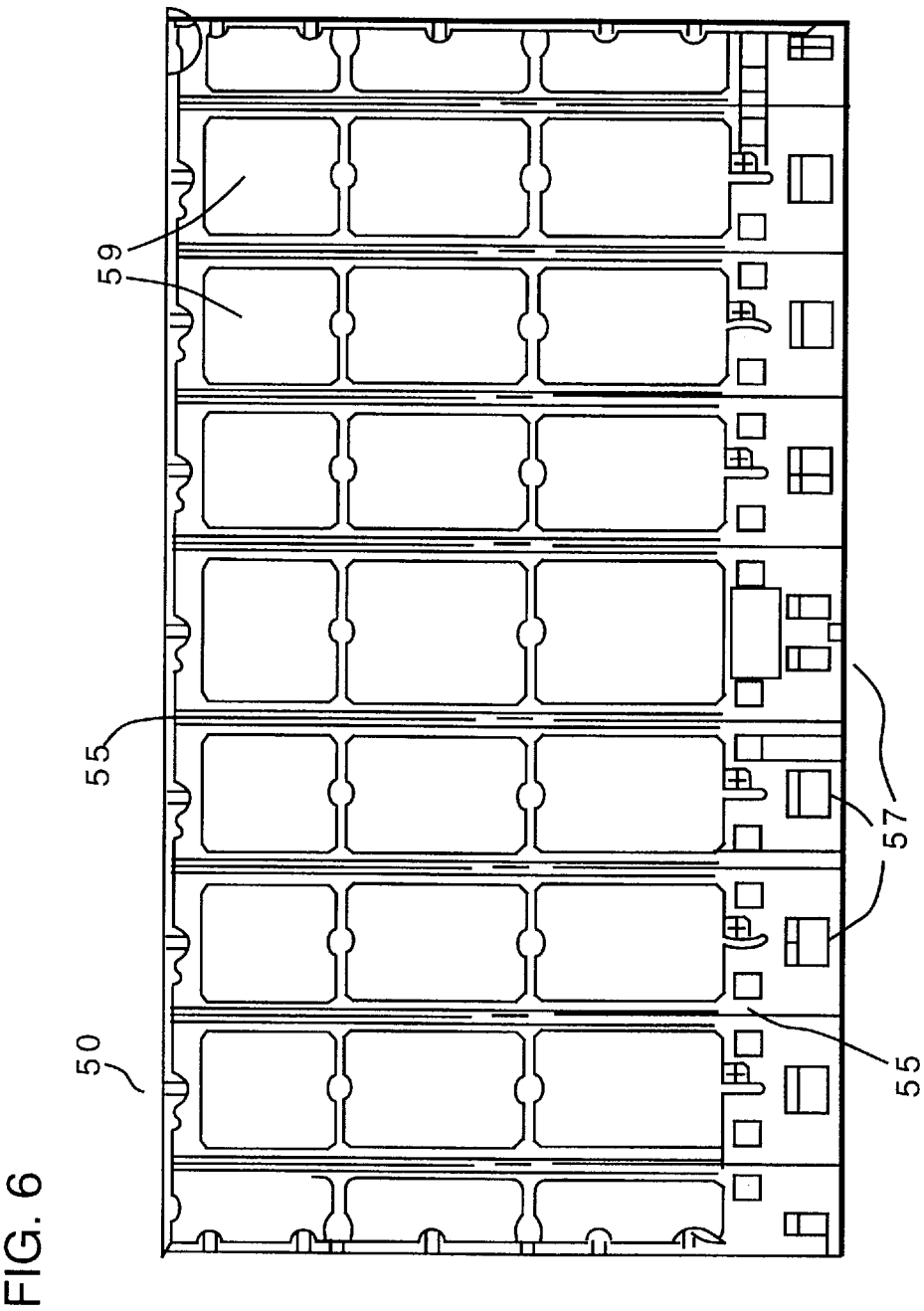
FIG. 6 is a schematic view taken from the top, of a chassis shelf according to the method and apparatus of the present invention.

In FIG. 6, a top view of a chassis shelf 50 constructed according to the method and apparatus of the present invention is shown. As can be seen, chassis shelf 50, includes a plurality of rails 55 which engage with guides 3 on the top and bottom of drive cover 01 to help the covered drive slide into its position in the cabinet or array. Placement openings 57, are cut out on each side of rails 55, to permit locking tabs 10d of ejector 10 to grip chassis shelf 50 and to help move the drive into position along rails 55, when it is being inserted. In a preferred embodiment, chassis shelf 50 is formed of die cast metal and also has a plurality of air shafts 59, through which air flow can be directed by an air moving device. In a preferred embodiment, these air shafts 59 cooperate with air channels 6 on each drive cover 01, to dissipate heat effectively within a large cabinet or array in which many drives are inserted.

Figure 7:
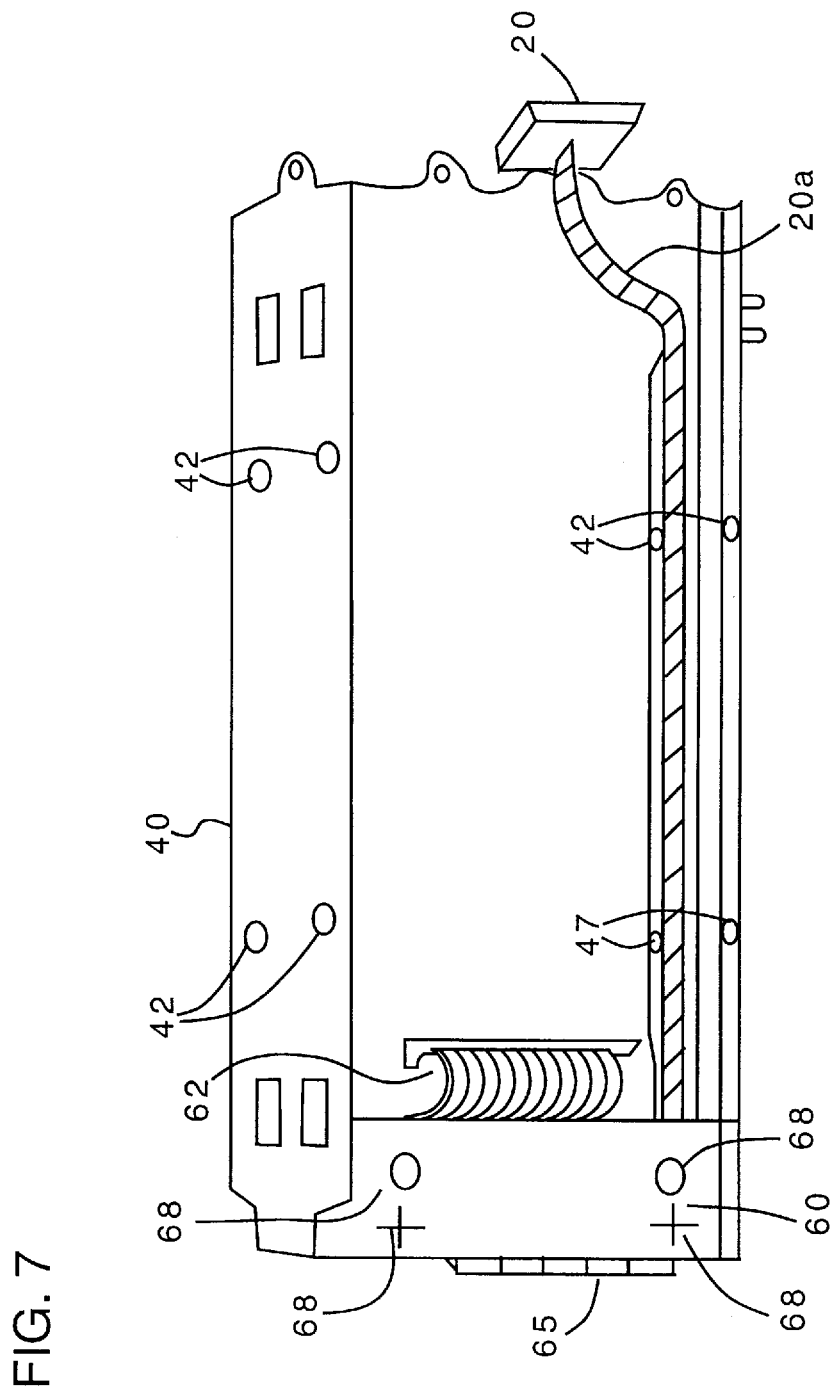
FIG. 7 is a perspective side view of a disk carrier according to the method and apparatus of the present invention.

Turning now to FIG. 7, a side view of a drive carrier 40 according to the method and apparatus of the present invention is shown. Here it can be seen, floating disk adaptor board 60 is attached by fasteners 68 to drive carrier 40. Floating disk adaptor board 60 is connected at one end to gang connector 65, and at the other end to a logic ribbon cable 62 and to an LED wire ribbon cable 20a. LED wire ribbon cable 20 is placed along the interior of drive carrier 40 and attached at its other end to LED panel 20, which is shown bolted on to the front of drive carrier 40. In a preferred embodiment, LED panel 20 and LED wire ribbon cable 20a can be activated by the overall system controller to indicate that this drive is active or should be removed. This feature of the present invention permits the removal LED indicator to be activated independently of a particular drive 35's logical controls, which can, in effect, be bypassed by the controller. This, in turn, minimizes the customizing needed for different drive types. In a preferred embodiment, LED wire ribbon cable 20a is taped to the interior of drive carrier 40 using a mylar tape.

Figure 8:
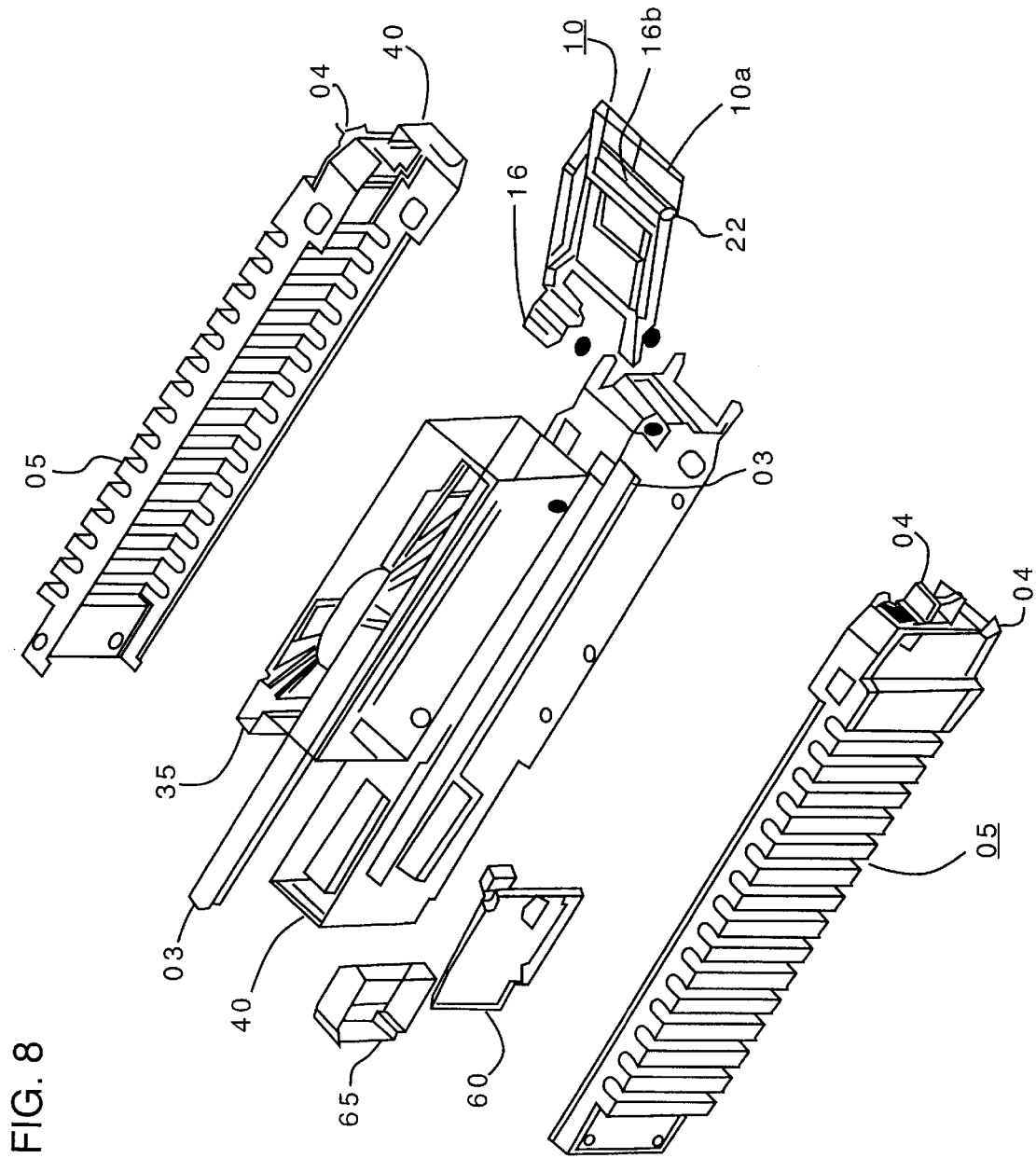
FIG. 8 is an exploded wire frame drawing of the present invention.

With respect now to FIG. 8, another exploded view of drive cover 01 of the present invention is shown, in wire diagram format. Here it can be seen that each cover 5 has two hubs 4 formed at one end. Ejector 10 is here depicted from the inside, with latch 16 shown as a separate device which is inserted through latch hole 16b in ejector 10. LED panel opening 22 in ejector 10 is also shown. As can be seen, these openings in front planar surface 10a of ejector 10 permit both the latch and the LED functions of the present invention to operate.

Figure 9:
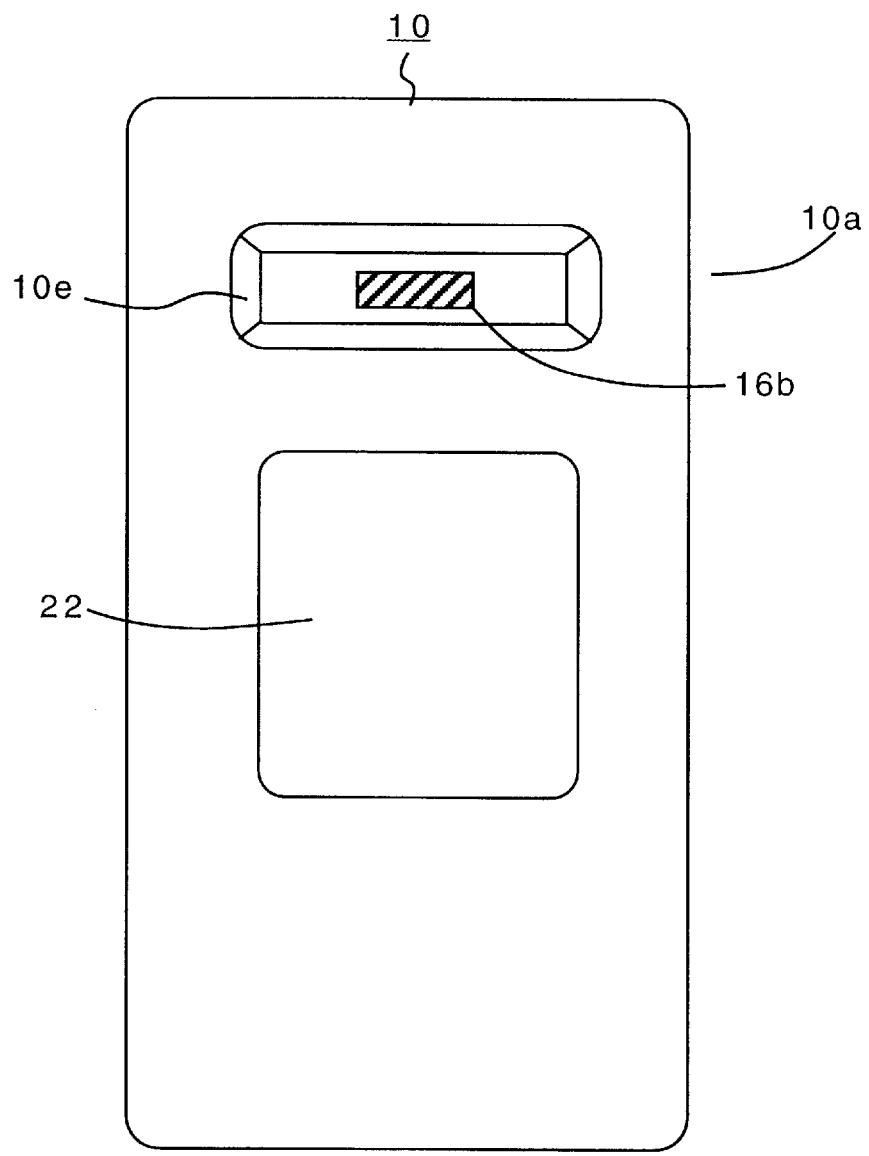
FIG. 9 is a perspective front view of the ejector of the present invention.

In FIG. 9, a front view of front planar surface 10a of ejector 10 is shown. Front planar surface 10a has two openings formed through it, LED panel opening 22, and latch opening 16b. As can be seen, latch opening 16b is placed inside a recessed area 10e of front planar surface 10a.

Figure 10:
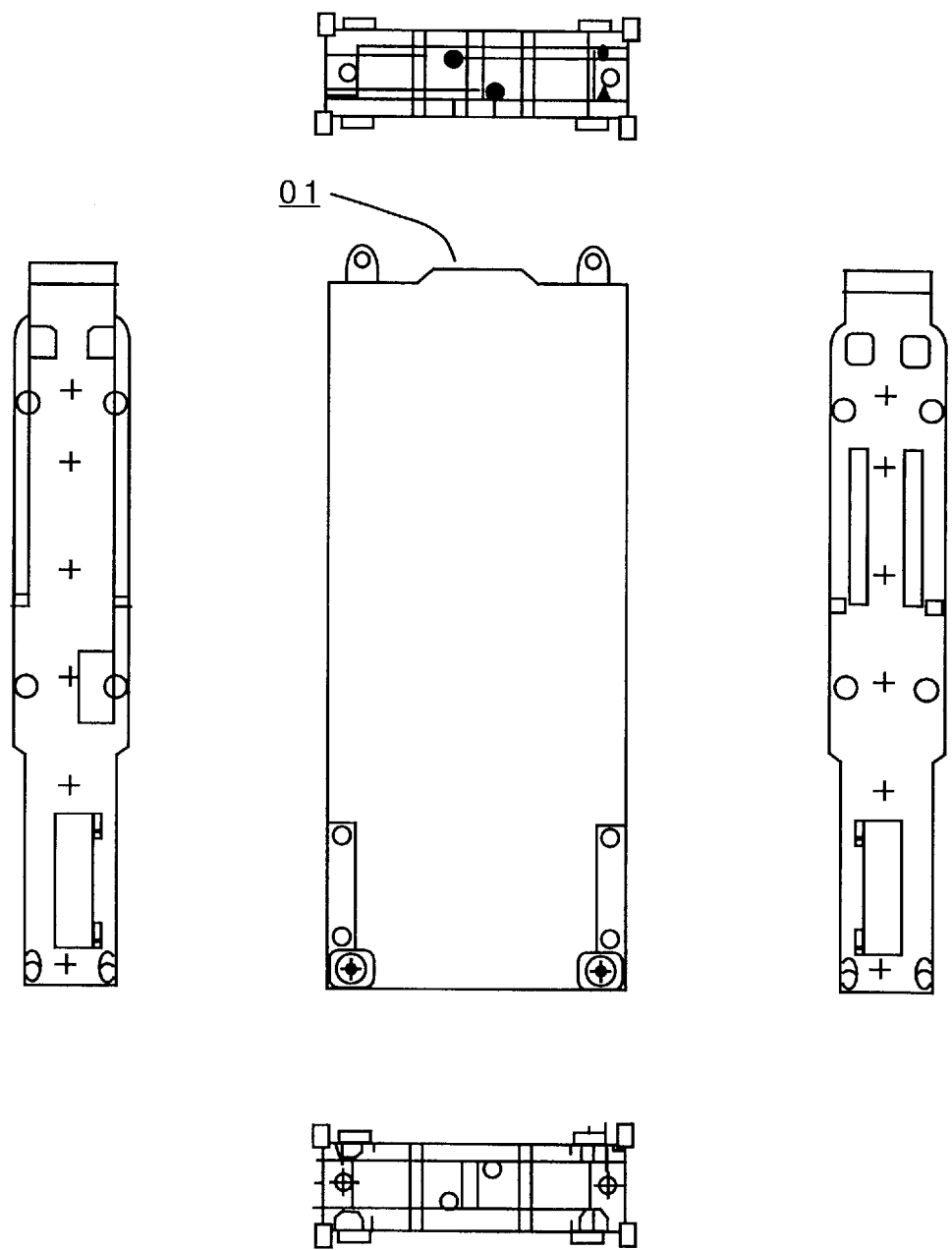
FIG. 10 is a schematic side view of the parts of the disk carrier of the present invention.

Turning now to FIG. 10, schematic views of disk carrier 40 are shown.

Figure 11A:
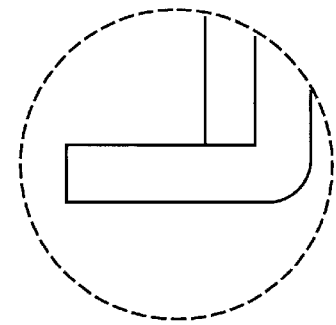
FIGS. 11, 11A and 11B are schematic views of the parts of the ejector of the present invention.
Figure 11:
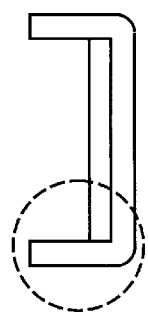
Figure 11B:
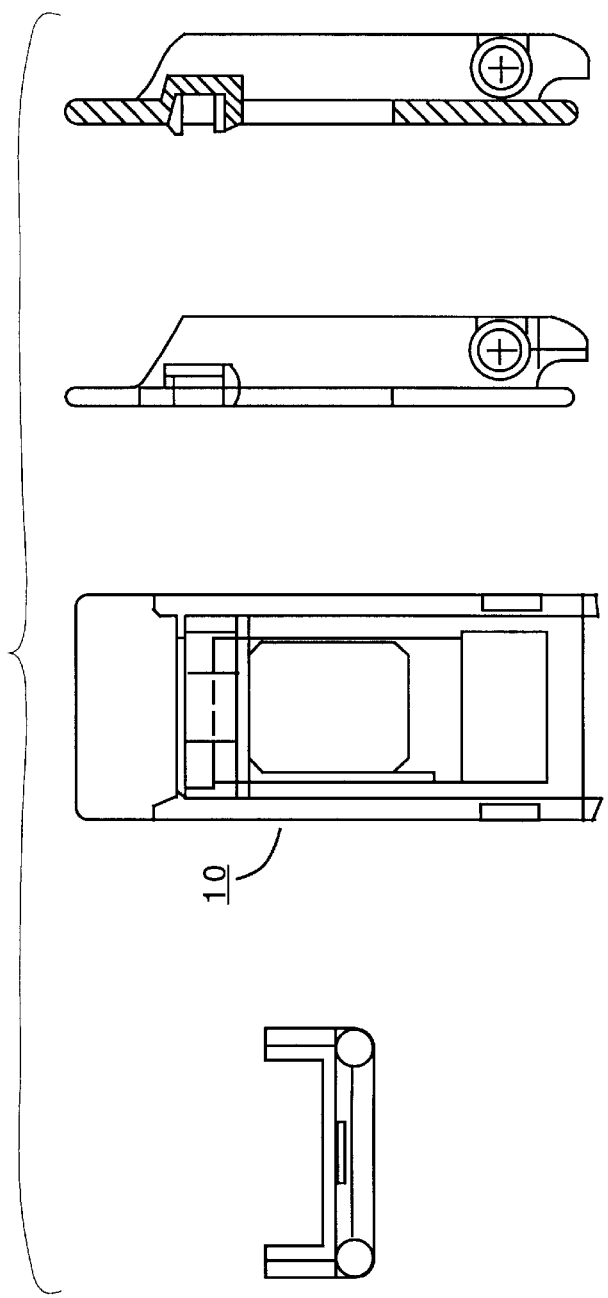
Figure 12:
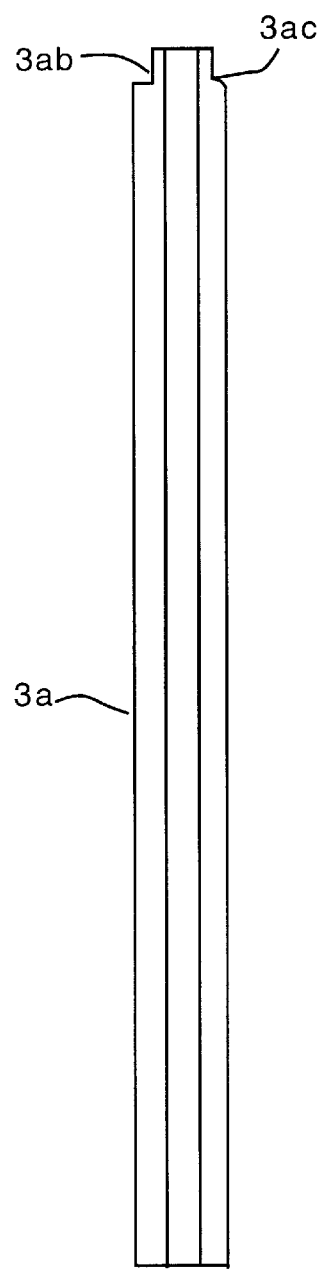
FIGS. 12, 12A 12B and 12C provide schematic views taken from the top and bottom faces of a guide constructed according to the method and apparatus of the present invention.
Figure 12A:
Figure 12B:
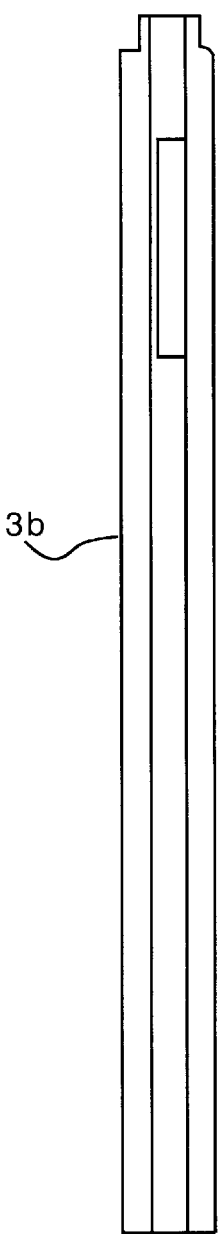
Figure 12C:
Figure 13:
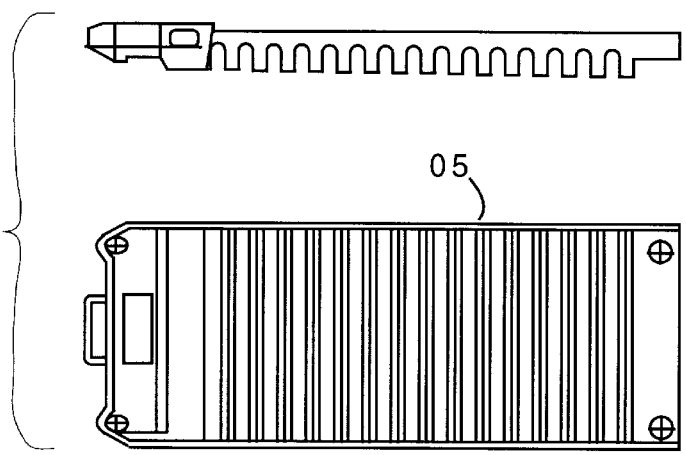
FIGS. 13, 13A–13I are schematic views from the side, top and bottom faces of a cover according to the method and apparatus of the present invention.
Figure 13A:
Figure 13B:
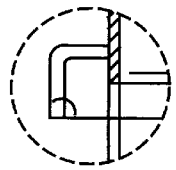
Figure 13C:
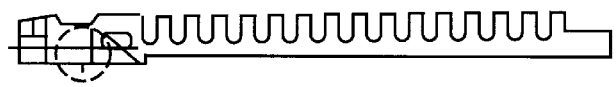
Figure 13D:
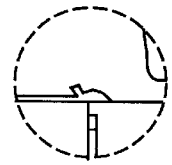
Figure 13E:
Figure 13F:
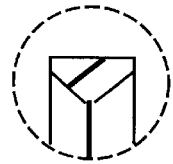
Figure 13G:
Figure 13H:
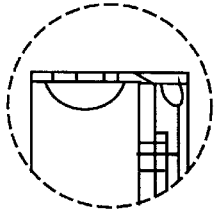
Figure 13I:
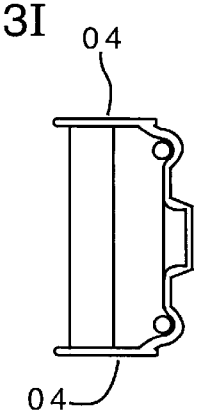
Figure 14:
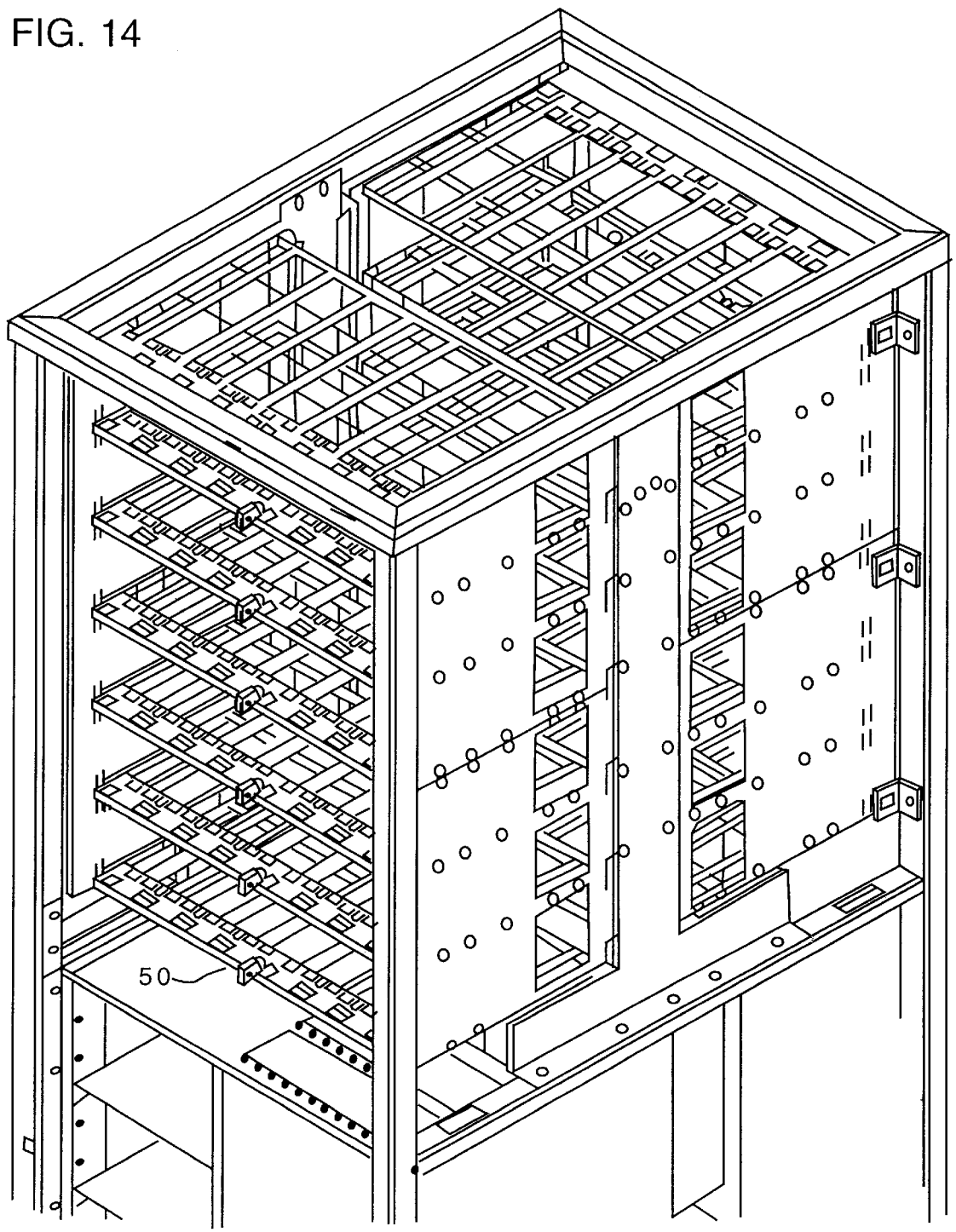
FIG. 14 is a perspective view of a housing having several chasses according to the method and apparatus of the present invention.

FIGS. 11, 11A and 11B depict portions of ejector 10 in schematic drawings. Typical dimensions of front planar surface 10a are shown, and the radiusing dimensions used to form bottom lip 10c are indicated. Side member 10b is shown as well, as is locking tab 10d.

Now in FIGS. 12, 12A, 12B and 12C guide 3 can be seen more clearly. The grooved face 3a is shown, having two grooves, 3ab and 3ac formed in it. A smooth face, 3b of guide 3 is also shown.

Next, in FIG. 13, 13A–13I the dimensions of a typical cover 5 are shown. In manufacturing, this and other external parts of the present invention are specifically constructed to have smooth edges without surface blemishes, voids, protrusions or depressions. Since the cover is being used to make the drive removable by a customer, smooth exterior surfaces minimize the possibility of any cutting or tearing.

Returning briefly to FIG. 8, the design of the present invention also simplifies the manufacturing process. In the exploded view of the parts shown in FIG. 8, it can be seen that disk drive 35 and the other parts can easily be placed on ESD mats, so that the assembler can put the entire device together without the need to balance the drive at any awkward angle. Drive 35 can be fastened inside drive carrier 40, and connected to floating board adaptor 60 and gang connector 65. Screws or other fasteners are used to hold covers 5 to drive carrier 40, ejector 10, and each other. Covers 5 are shaped symmetrically to fit around guides 3 already hot staked to drive carrier 40. Ejector 10 is screwed through openings 14 in its lower extremities to covers 05. Thus, ejector 10 also helps hold covers 05 together around disk carrier 40. Latch 16 is popped into place inside openings 16b in ejector 10 and 16a in cover 05.

What is claimed is:

1. An apparatus for covering a removable storage system peripheral to be mounted in a housing, comprising:
   a rigid cover comprised of two symmetrical side covers, each having a pair of hubs, and each having a plurality of air channels for dissipating heat formed along it in such a way that the spaces formed by said air channels do not permit objects wider than a predetermined width to be inserted between them;
   a latch and a latch opening in said rigid cover;
   a drive carrier for mounting said removable storage system peripheral, said drive carrier having a rigid shell for containing a removable storage system peripheral, and having apertures through which fasteners can be inserted to mount said removable storage system peripheral within said drive carrier;
   a chassis shelf inside said housing, said chassis shelf having at least one rail and at least one tab opening;
   a backplane located inside said housing, said backplane having pin connectors and guide pins associated therewith;
   a floating drive adaptor board attached to said removable storage system peripheral inside said drive carrier, said floating drive adaptor board having a female gang connector for mating with said pin connectors in said backplane and guide pin receptors for mating with said guide pins in said backplane;
   an ejector having a locking tab for gripping said tab opening in said chassis shelf, and a latch insertion area for inserting said latch to engage with said latch opening in said rigid cover, said ejector also having an ejection lip for engaging said chassis shelf to propel a covered removable storage system peripheral out of said housing for removal;
   an LED panel mounted on said rigid cover and electrically connected to control logic in said storage system; and
   fasteners for fastening said side covers to said drive carrier containing said removable storage system peripheral, and said ejector so that said ejector can be used to insert said removable storage system peripheral along said guides and rails of said chassis shelf, to form a stable physical and electrical connection with said backplane, and said air channels in said rigid cover cooperate with air flow in said housing to dissipate heat.

2. An apparatus for covering a removable storage system peripheral to be mounted in a housing, comprising:
   a rigid cover shaped and dimensioned from a pair of symmetrical side covers, each of said side covers having a plurality of air channels for dissipating heat formed along it in such a way that the spaces formed by said air channels do not permit objects wider than a predetermined width to be inserted between them;
   a drive carrier for mounting said removable storage system peripheral, said drive carrier forming a rigid shell for containing a removable storage system peripheral, said drive carrier also having apertures through which fasteners can be inserted to mount said removable storage system peripheral within said drive carrier; and
   fasteners for fastening said rigid cover to said drive carrier containing said removable storage system peripheral through said apertures, so that said air channels in said covered removable storage system peripheral cooperate with air flow in said storage system to dissipate heat.

3. The apparatus of claim 2, wherein each of said side covers includes a pair of hubs formed at one end.

4. The apparatus of claim 2, wherein said housing includes:
   a chassis shelf having a rail and a tab opening; and
   a backplane having pin connectors and guide pins associated therewith.

5. The apparatus of claim 4, wherein said rigid cover includes at least one guide for sliding a covered removable storage system peripheral along said rail of said chassis shelf.

6. The apparatus of claim 2, wherein said rigid cover includes an ejector pivotally attached to said cover.

7. The apparatus of claim 6, wherein said drive carrier further includes a floating drive adaptor board having a female gang connector attached at one end and having a ribbon cable connecting to a removable storage system peripheral mounted inside said carrier.

8. The apparatus of claim 7, wherein said ejector further comprises a locking tab for engaging with said chassis shelf and said tab opening to insert said covered removable storage system peripheral to engage said female gang connector with said pin connector and said guide pins in said backplane to create a stable electrical connection.

9. The apparatus of claim 7, wherein said ejector further includes:
   a latch; and
   an ejection lip that engages with said chassis shelf to propel said covered removable storage system peripheral out of said housing when said latch is released.

10. An apparatus for covering a removable storage system peripheral to be mounted in a housing, comprising:
   a rigid cover shaped and dimensioned from a pair of symmetrical side covers, each of said side covers having a plurality of air channels for dissipating heat formed along it in such a way that the spaces formed by said air channels do not permit objects wider than a predetermined width to be inserted between them, said rigid cover also having guides along its opposing top and bottom exteriors and a pair of hubs at one end;
   a drive carrier for mounting said removable storage system peripheral, said drive carrier forming a rigid shell for containing a removable storage system peripheral, and having apertures through which fasteners can be inserted to mount said removable storage system peripheral, within said drive carrier;

fasteners for fastening said rigid cover to said drive carrier containing said removable storage system peripheral; and an ejector pivotally attached to said rigid cover, for propelling a covered removable storage system peripheral into and out of said housing.

11. The apparatus of claim 10, wherein said housing includes:

a chassis shelf having a rail and a tab opening; and a backplane having pin connectors and guide pins associated therewith.

12. The apparatus of claim 11, wherein said ejector includes at lest one locking tab to grip said tab opening in said chassis shelf and propel said covered removable storage system peripheral upon said guides along said rail for connection with said pin connectors in said backplane and snapping onto a first hub in said rigid cover to form a stable physical connection.

13. The apparatus of claim 12 wherein said ejector includes a latch and an ejection lip that engages with said chassis shelf to propel said covered removable storage system peripheral out of said housing when said latch is released.

14. The apparatus of claim 13, wherein said rigid cover further comprises a pair of symmetrical side covers, each of said side covers having a plurality of air channels for dissipating heat formed along it in such a way that the spaces formed by said air channels do not permit objects wider than a predetermined width to be inserted between them and said air channels cooperate with air flow in said housing to dissipate heat.

15. The apparatus of claim 14, wherein said ejector cooperates with said fasteners to hold said symmetrical side covers together.

16. The apparatus of claim 15, wherein said drive carrier further includes a floating drive adaptor board having a female gang connector with guide pin receptors disposed upon it attached at one end and having a ribbon cable connecting to a removable storage system peripheral mounted inside said carrier.

17. The apparatus of claim 16, wherein said ejector cooperates with said gang connector in said floating drive adaptor board, said pin connectors in said backplane, and said hubs on said rigid cover to form a stable electrical connection.

18. The apparatus of claim 16, wherein said ejector cooperates with said guide pins in said backplane and said guide pin receptors in said female gang connector to prevent improper insertion of said covered removable storage system peripheral into said backplane.

19. The apparatus of claim 16 further comprising:

an LED panel having at least one indicator light, mounted on said rigid cover and showing through an opening in said ejector:

a wire ribbon cable connected to said floating drive adaptor board and running inside said rigid cover to connect to said LED panel; and control logic in said storage system for signalling through said backplane to said floating drive adaptor board to activate said indicator light on said LED panel for notifying an operator to remove said covered removable storage system peripheral.

20. A drive carrier for a removable storage system peripheral to be mounted in a housing, comprising a rigid shell shaped and dimensioned from a pair of symmetrical side covers, each of said side covers having a plurality of air channels for dissipating heat formed along it in such a way that the spaces formed by said air channels do not permit objects wider than a predetermined width to be inserted between them for containing a removable storage system peripheral said shell having a plurality of apertures through which fasteners can be inserted to mount one of a number of different types of said removable storage system peripheral within said drive carrier, and said shell including apertures for attaching a floating drive adaptor board in at least two different placements inside said rigid shell.

21. An apparatus for covering a removable storage system peripheral to be mounted in a housing, comprising:

a rigid cover means shaped and dimensioned from a pair of symmetrical side cover means, each of said side cover means having a plurality of air channel means for dissipating heat formed along it in such a way that the spaces formed by said air channel means do not permit objects wider than a predetermined width to be inserted between them;

a drive carrier means for mounting said removable storage system peripheral within itself, said drive carrier means forming a rigid shell for containing a removable storage system peripheral, said drive carrier also having apertures through which fasteners can be inserted to mount said removable storage system peripheral within said drive carrier; and fastening means for fastening said rigid cover means to said drive carrier means containing said removable storage system peripheral through said apertures, so that said air channel means in said covered removable storage system peripheral cooperate with air flow means in said storage system to dissipate heat.

22. The apparatus of claim 21, wherein said rigid cover means further comprises a pair of symmetrical side covers, each of said side covers having a plurality of said air channel means as well as a pair of hub means formed at one end.

23. The apparatus of claim 21, wherein said housing includes:

a chassis shelf means having a rail means and a tab opening means; and a backplane means having pin connectors means and guide pins associated therewith.

24. The apparatus of claim 23, wherein said rigid cover means includes at least one guide means for sliding a covered removable storage system peripheral along said rail means of said chassis shelf means.

25. The apparatus of claim 21, wherein said rigid cover means includes an ejector means pivotally attached to said rigid cover means.

26. The apparatus of claim 25, wherein said drive carrier means further includes a floating drive adaptor board means having a female gang connector means attached at one end and having a ribbon cable means connecting to a removable storage system peripheral mounted inside said drive carrier means.

27. The apparatus of claim 26, wherein said ejector means further comprises a locking means for engaging with said chassis shelf means and said tab opening means to insert said covered removable storage system peripheral to engage said gang connector means with said pin connector means and said guide pins in said backplane means to create a stable electrical connection.

28. The apparatus of claim 27, wherein said ejector means further includes:

a latch means; and an ejection lip means that engages with said chassis shelf means to propel said covered removable storage system peripheral out of said housing when said latch means is released.

29. An apparatus for covering a removable storage system peripheral to be mounted in a housing, comprising:

a rigid cover means shaped and dimensioned from a pair of symmetrical side covers, each of said side covers having a plurality of air channels for dissipating heat formed along it in such a way that the spaces formed by said air channels do not permit objects wider than a predetermined width to be inserted between them, said cover means also having guides means along its opposing top and bottom exteriors and a pair of hub means at one end;

a drive carrier means for mounting said removable storage system peripheral, said drive carrier means forming a rigid shell for containing a removable storage system peripheral, and having aperture means through which fastening means can be used to mount said removable storage system peripheral, within said drive carrier means;

fastening means for fastening said rigid cover means to said drive carrier means containing said removable storage system peripheral; and an ejector means pivotally attached to said rigid cover means, for propelling a covered removable storage system peripheral into and out of said housing.

30. The apparatus of claim 29, wherein said housing includes:

a chassis shelf means having a rail means and a tab opening means; and a backplane means having pin connector means and guide pin means associated therewith.

31. The apparatus of claim 30 wherein said ejector means includes at least one locking means to grip said tab opening means in said chassis shelf means and propel said covered removable storage system peripheral upon said guides means along said rail means for connection with said pin connector means in said backplane means and snapping onto a first hub means in said rigid cover means to form a stable physical connection.

32. The apparatus of claim 31 wherein said ejector means includes a latch means and an ejection lip means that engages with said chassis shelf means to propel said covered removable storage system peripheral out of said housing when said latch means is released.

33. The apparatus of claim 32, wherein said rigid cover means further comprises a pair of symmetrical side cover means, each of said side cover means having a plurality of air channel means for dissipating heat formed along it in such a way that the spaces formed by said air channel means do not permit objects wider than a predetermined width to be inserted between them and said air channel means cooperate with air flow means in said housing to dissipate heat.

34. The apparatus of claim 33 wherein said ejector means cooperates with said fastening means to hold said symmetrical side cover means together.

35. The apparatus of claim 34, wherein said drive carrier means further includes a floating drive adaptor board means having a female gang connector means with guide pin receptor means disposed upon it attached at one end and having a ribbon cable means connecting to a removable storage system peripheral mounted inside said carrier means.

36. The apparatus of claim 34, wherein said ejector means cooperates with said gang connector means in said floating drive adaptor board means, said pin connector means in said backplane means, and said hub means on said rigid cover means to form a stable electrical connection.

37. The apparatus of claim 36, wherein said ejector means cooperates with said guide pin means in said backplane means and said guide pin receptor means in said gang connector means to prevent improper insertion of said covered removable storage system peripheral into said backplane means.

38. The apparatus of claim 37, further comprising:

an LED panel means having at least one-indicator means, mounted on said rigid cover means and showing through an opening in said ejector means:

a wire ribbon cable means connected to said floating drive adaptor board means and running inside said rigid cover means to connect to said LED panel means; and control logic means in said storage system for signalling through said backplane means to said floating drive adaptor board means to activate said indicator means on said LED panel means for notifying an operator to remove said covered removable storage system peripheral.

* * * * *